(12) United States Patent
Narayanan et al.

(10) Patent No.: US 9,859,893 B1
(45) Date of Patent: Jan. 2, 2018

(54) HIGH SPEED VOLTAGE LEVEL SHIFTER

(71) Applicant: QUALCOMM Incorporated, San Diego, CA (US)

(72) Inventors: Venkat Narayanan, San Diego, CA (US); Rakesh Vattikonda, San Diego, CA (US); De Lu, San Diego, CA (US); Ramaprasath Vilangudipitchai, San Diego, CA (US); Samrat Sinharoy, San Diego, CA (US); Rui Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/367,706

(22) Filed: Dec. 2, 2016

Related U.S. Application Data

(60) Provisional application No. 62/357,164, filed on Jun. 30, 2016.

(51) Int. Cl.
*H03K 3/35* (2006.01)
*H03K 19/00* (2006.01)
*G09G 3/20* (2006.01)
*H03K 19/0185* (2006.01)
*H03K 3/356* (2006.01)

(52) U.S. Cl.
CPC ............. *H03K 19/018521* (2013.01); *H03K 3/356113* (2013.01); *H03K 19/0013* (2013.01)

(58) Field of Classification Search
None
See application file for complete search history.

(56) References Cited

U.S. PATENT DOCUMENTS

| | | |
|---|---|---|
| 6,445,210 B2 | 9/2002 | Nojiri |
| 6,717,452 B2 | 4/2004 | Carpenter et al. |
| 7,030,678 B1 | 4/2006 | Burinskiy et al. |
| 7,091,768 B2 | 8/2006 | Lee et al. |
| 7,205,820 B1 | 4/2007 | Yeung et al. |
| 7,683,667 B2 | 3/2010 | Kim et al. |
| 7,772,891 B1 | 8/2010 | Yang et al. |
| 7,800,407 B1 | 9/2010 | Agarwal et al. |

(Continued)

FOREIGN PATENT DOCUMENTS

JP   H11122092 A   4/1999

OTHER PUBLICATIONS

International Search Report and Written Opinion—PCT/US2017/037335—ISA/EPO—Sep. 15, 2017.

*Primary Examiner* — Dedei K Hammond
(74) *Attorney, Agent, or Firm* — Loza & Loza, LLP/Qualcomm

(57) ABSTRACT

In one embodiment, a voltage level shifter includes a first NOR gate having a first input configured to receive a first input signal in a first power domain, a second input configured to receive an enable signal in a second power domain, a third input, and an output. The voltage level shifter also includes a second NOR gate having a first input configured to receive a second input signal in the first power domain, a second input configured to receive the enable signal in the second power domain, a third input coupled to the output of the first NOR gate, and an output coupled to the third input of the first NOR gate. The first and second NOR gates are powered by a supply voltage of the second power domain.

22 Claims, 12 Drawing Sheets

(56) References Cited

U.S. PATENT DOCUMENTS

| | | | |
|---|---|---|---|
| 7,839,170 B1* | 11/2010 | Yang | H03K 3/356182 |
| | | | 326/68 |
| 8,362,806 B2 | 1/2013 | Wijeratne et al. | |
| 8,892,930 B2 | 11/2014 | Yeh et al. | |
| 8,994,402 B2 | 3/2015 | Hwang et al. | |
| 9,257,973 B1 | 2/2016 | Shay | |
| 2006/0044014 A1* | 3/2006 | Chen | H03K 3/356104 |
| | | | 326/81 |
| 2006/0103430 A1 | 5/2006 | Yuan et al. | |
| 2006/0290404 A1 | 12/2006 | Law | |
| 2008/0157815 A1 | 7/2008 | Williams | |
| 2009/0102508 A1 | 4/2009 | Agarwal | |
| 2009/0108904 A1 | 4/2009 | Shiffer, II | |
| 2010/0026343 A1 | 2/2010 | Yang et al. | |
| 2012/0206182 A1 | 8/2012 | Dally | |
| 2016/0134286 A1 | 5/2016 | Bowles et al. | |
| 2017/0047930 A1 | 2/2017 | Chai et al. | |
| 2017/0063351 A1 | 3/2017 | Kurokawa | |
| 2017/0149435 A1 | 5/2017 | Song | |

\* cited by examiner

HIGH SPEED VOLTAGE LEVEL SHIFTER

RELATED APPLICATION

This application claims priority to U.S. Provisional Application No. 62/357,164 filed on Jun. 30, 2016, the entire specification of which is incorporated herein by reference.

BACKGROUND

Field

Aspects of the present disclosure relate generally to level shifters, and more particularly to voltage level shifters.

Background

A chip may include different power domains (also referred to as voltage domains), where each power domain may correspond to a different supply voltage. For example, a first power domain may have a lower supply voltage to reduce power consumption of circuits in the first power domain, and a second power domain may have a higher supply voltage to increase the performance of circuits in the second power domain and/or to power input/output (I/O) devices in the second power domain. One or more voltage level shifters may be used to facilitate communication between circuits in different power domains. For example, a level shifter may allow a signal to cross from one power domain to another power domain by shifting the voltage level of the signal.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

One aspect relates to a voltage level shifter. The voltage level shifter includes a first NOR gate having a first input configured to receive a first input signal in a first power domain, a second input configured to receive an enable signal in a second power domain, a third input, and an output. The voltage level shifter also includes a second NOR gate having a first input configured to receive a second input signal in the first power domain, a second input configured to receive the enable signal in the second power domain, a third input coupled to the output of the first NOR gate, and an output coupled to the third input of the first NOR gate. The first and second NOR gates are powered by a supply voltage of the second power domain.

A second aspect relates to a method for performing voltage level shifting using a voltage level shifter, the voltage level shifter including first and second cross-coupled NOR gates.

The method includes inputting a first input signal in a first power domain to the first NOR gate, inputting a second input signal in the first power domain to the second NOR gate; and inputting an enable signal in a second power domain to the first and second NOR gates to enable the voltage level shifter.

A third aspect relates to an interface. The interface includes a first buffer in a first power domain, and a voltage level shifter. The voltage level shifter includes a first NOR gate having a first input configured to receive a first input signal from the first buffer in the first power domain, a second input configured to receive an enable signal in a second power domain, a third input, and an output. The voltage level shifter also includes a second NOR gate having a first input configured to receive a second input signal in the first power domain, a second input configured to receive the enable signal in the second power domain, a third input coupled to the output of the first NOR gate, and an output coupled to the third input of the first NOR gate. The first and second NOR gates are powered by a supply voltage of the second power domain.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
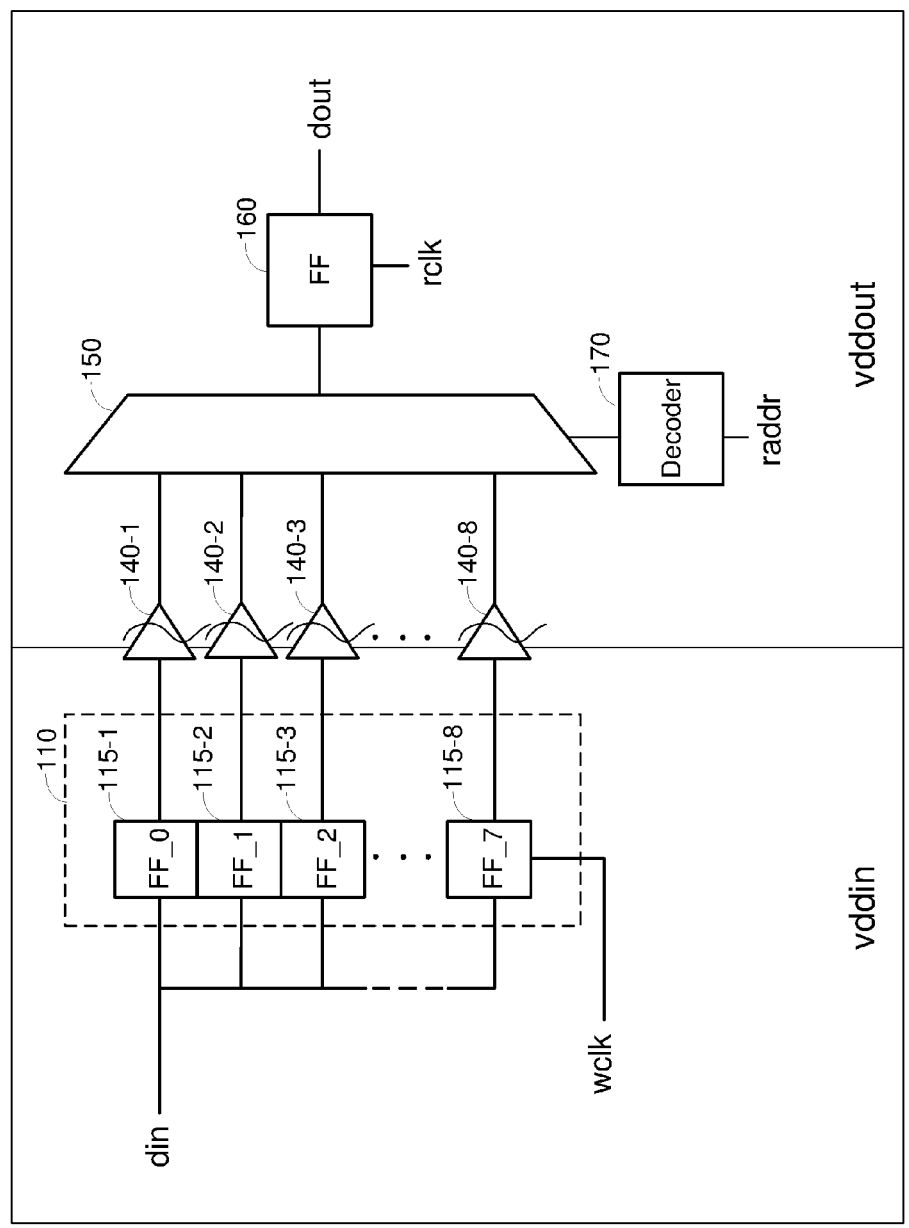
FIG. 1 shows an example of an interface including multiple level shifters according to certain aspects of the present disclosure.

One or more voltage level shifters may be used to facilitate communication between circuits in different power domains (also referred to as voltage domains). For example, a level shifter may allow a signal to cross from one power domain to another power domain by shifting the voltage level of the signal. In this regard, FIG. 1 shows an example of an interface between first and second power domains. The supply voltage of the first power domain is vddin, and the supply voltage of the second power domain is vddout, in which vddout is higher than vddin (e.g., at least 20 percent higher).

In this example in FIG. 1, the interface includes a first first-in first-out buffer (FIFO) 110, multiple level shifters 140-1 to 140-8, a multiplexer 150, a decoder 170, and a second FIFO 160. The first FIFO 110 is located in the first power domain (denoted "vddin"), and the multiplexer 150, the decoder 170, and the second FIFO 160 are located in the second power domain (denoted "vddout"). The level shifters 140-1 to 140-8 are configured to voltage level shift signals from the first power domain to the second power domain, as discussed further below.

In the example shown in FIG. 1, the first FIFO 110 includes eight registers 115-1 to 115-8, in which each register may be configured to store a bit in the first power domain. However, it is to be appreciated that the first FIFO 110 is not limited to this example, and that each register may be capable of storing more than one bit at a time. In operation, the first FIFO 110 may receive input data bits (denoted "din") from a circuit (e.g., processor) in the first power domain. The input data bits may be written into the registers 115-1 to 115-8 according to a first clock signal (denoted "wclk").

In the example shown in FIG. 1, each of the level shifters 140-1 to 140-8 is coupled to a respective one of the registers 115-1 to 115-8. Each level shifter is configured to voltage level shift the bit in the respective register from the first power domain to the second power domain, and output the bit in the second power domain.

The multiplexer 150 has multiple inputs coupled to the outputs of the level shifters 140-1 to 140-8, and is configured to selectively couple the outputs of the level shifters to the second FIFO 160 one at a time based on a read address signal (denoted "raddr"). In this regard, the decoder 170 may be configured to receive the read address signal, in which the read address signal indicates which one of the registers of the first FIFO 115-1 to 115-8 is to be read at a given time. The decoder 170 may then command the multiplexer 150 to select the respective level shifter to read the bit from the register, and output the read bit to the second FIFO 160. The read bit is written to the second FIFO 160 in the second power domain since the respective level shifter level shifts the bit from the first power domain to the second power domain, as discussed above.

The read address signal may address each of the registers one at a time such that the data bits in the registers 115-1 to 115-8 are read out one at a time and written to the second FIFO 160. The data bits may be read out of the registers 115-1 to 115-8 according to a second clock signal (denoted "rclk"). As discussed above, the data bits may be written to the registers 115-1 to 115-8 according to the first clock signal (denoted "wclk"). Thus, the data bits may be written into the first FIFO 110 according to the first clock signal wclk and read out of the first FIFO 110 according to the second clock signal rclk. The first and second clock signals may be asynchronous with one another (e.g., have different frequencies). Thus, in this example, the interface also provides an interface between different clock domains, as well as an interface between different power domains. The data bits in the second FIFO 160 may then be output to a circuit in the second power domain for further processing.

FIG. 1 shows an example in which level shifters are used to voltage level shift digital signals from a lower power domain (i.e., first power domain) to a higher power domain (i.e., second power domain). In this example, the digital signals may have a voltage range of approximately vddin in the lower power domain and a voltage range of approximately vddout in the higher power domain. As used herein, the voltage range of a signal may refer to the difference between the maximum voltage and the minimum voltage of the signal, and may also be referred to as a voltage swing of the signal.

The interface shown in FIG. 1 illustrates one example in which level shifters may be used to level shift signals between two different power domains. However, it is to be appreciated that the present disclosure is not limited to this example. In general, level shifters may be used to voltage level shift signals in a chip with multiple power domains to enable the signals to cross from one power domain to another power domain on the chip. Also, it is to be appreciated that the interface is not limited to the example of FIFOs (which are typically used for data exchange between different cores), and may use other types of buffers to buffer data bits. Further, it is to be appreciated that other signals (such as control signals, clock signals, etc.) can be sent from one power domain to another power domain (i.e., across power domains) using level shifters.

Figure 2:
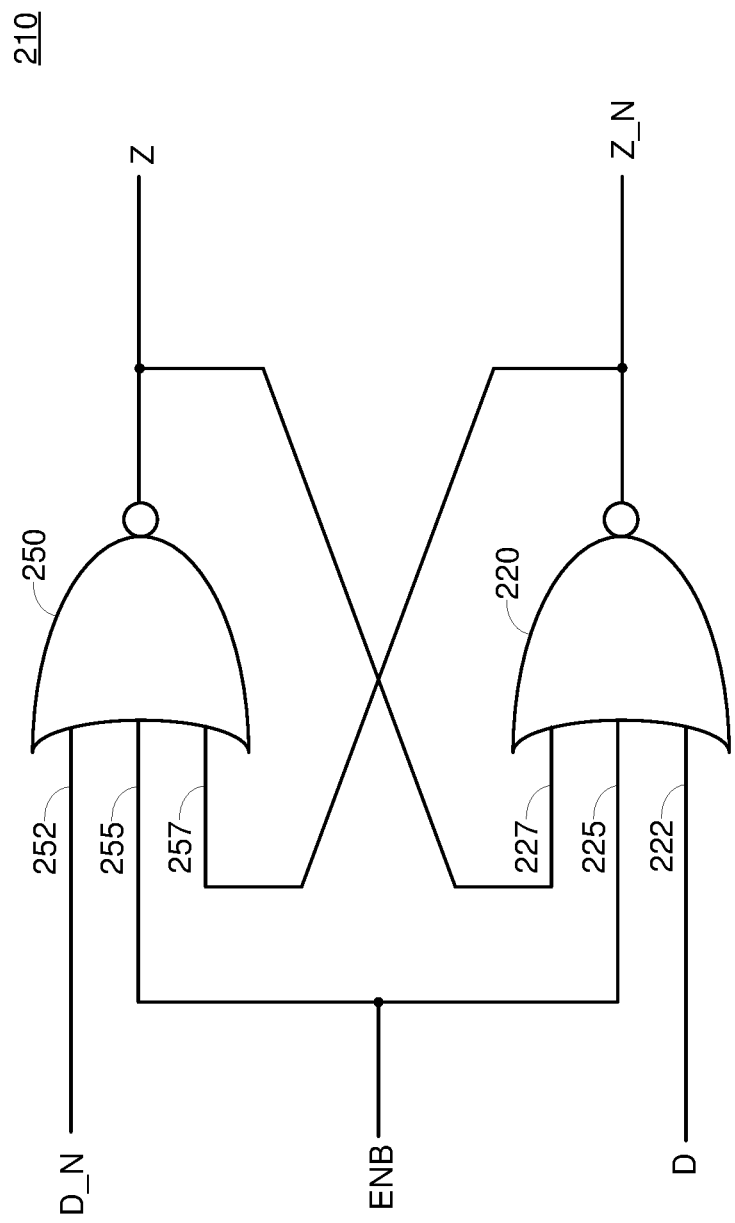
FIG. 2 shows a voltage level shifter according to certain aspects of the present disclosure.

FIG. 2 shows an example of a level shifter 210 according to aspects of the present disclosure. The level shifter 210 is configured to voltage level shift a signal from a lower power domain to a higher power domain, and may be used to implement each of the level shifters 140-1 to 140-8 shown in FIG. 1. The lower power domain has a supply voltage of vddin and the higher power domain has a supply voltage of vddout, in which vddout is higher than vddin (e.g., at least 20 percent higher). In the discussion below, the lower power domain is referred to as the vddin domain, and the higher power domain is referred to as the vddout domain.

The level shifter 210 includes a first NOR gate 220 and a second NOR gate 250 that are cross-coupled to form a latch based level shifter, as shown in FIG. 2. The first NOR gate 220 has a first input 222 configured to receive an input signal D in the vddin domain, a second input 225 configured to receive an enable signal ENB in the vddout domain, and a third input 227 coupled to the output of the second NOR gate 250. The second NOR gate 250 has a first input 252 configured to receive input signal D_N in the vddin domain, a second input 255 configured to receive the enable signal ENB in the vddout domain, and a third input 257 coupled to the output of the first NOR gate 220. The input signal D_N is the complement (inverse) of the input signal D, and may be produced by passing the signal D through an inverter in the vddin domain. The output signals Z_N and Z of the first and second NOR gates 220 and 250, respectively, are in the vddout domain.

In certain aspects, the first and second NOR gates 220 and 250 are powered by the supply voltage of the vddout domain with no transistors sitting in the vddin domain, as discussed further below. As discussed above, the input signals D and D_N are in the vddin domain. Thus, the input signals D and D_N may each have a voltage range of approximately vddin, in which a logic value of one corresponds to a voltage of approximately vddin and a logic value of zero corresponds to approximately ground. The enable signal ENB is in the vddout domain, and therefore may have a voltage range of approximately vddout, in which a logic value of one corresponds to a voltage of approximately vddout and a logic value of zero corresponds to approximately ground. The output signals Z and Z_N are in the vddout domain, and therefore may have a voltage range of approximately vddout, in which a logic value of one corresponds to a voltage of approximately vddout and a logic value of zero corresponds to approximately ground. When the level shifter 210 is enabled, the output signals Z and Z_N provide the level-shifted versions of input signals D and D_N, respectively, as discussed further below.

In operation, the logic value of the enable signal ENB controls whether the level shifter 210 is enabled. In one aspect, the level shifter 210 is disabled when the enable signal ENB is at logic one (i.e., ENB=1), which corresponds to a voltage of approximately vddout since the enable signal ENB is in the vddout domain. In this case, the outputs Z and Z_N are both at logic zero.

The level shifter 210 is enabled when the enable signal ENB is at logic zero (i.e., ENB=0). In this case, the output signal Z may have the same logic value as the input signal D, but in the vddout domain. For example, if the input signal D has a logic value of one in the vddin domain corresponding to a voltage of approximately vddin, then the output signal Z may have a logic value of one in the vddout domain corresponding to a voltage of approximately vddout. Thus, the level shifter 210 shifts the voltage of the input signal D from the vddin domain to the vddout domain to produce the output signal Z. The output signal Z_N may be the complement (inverse) of the output signal Z, and therefore may have the same logic value as the input signal D_N, but in the vddout domain.

Figures 3A, 3B:
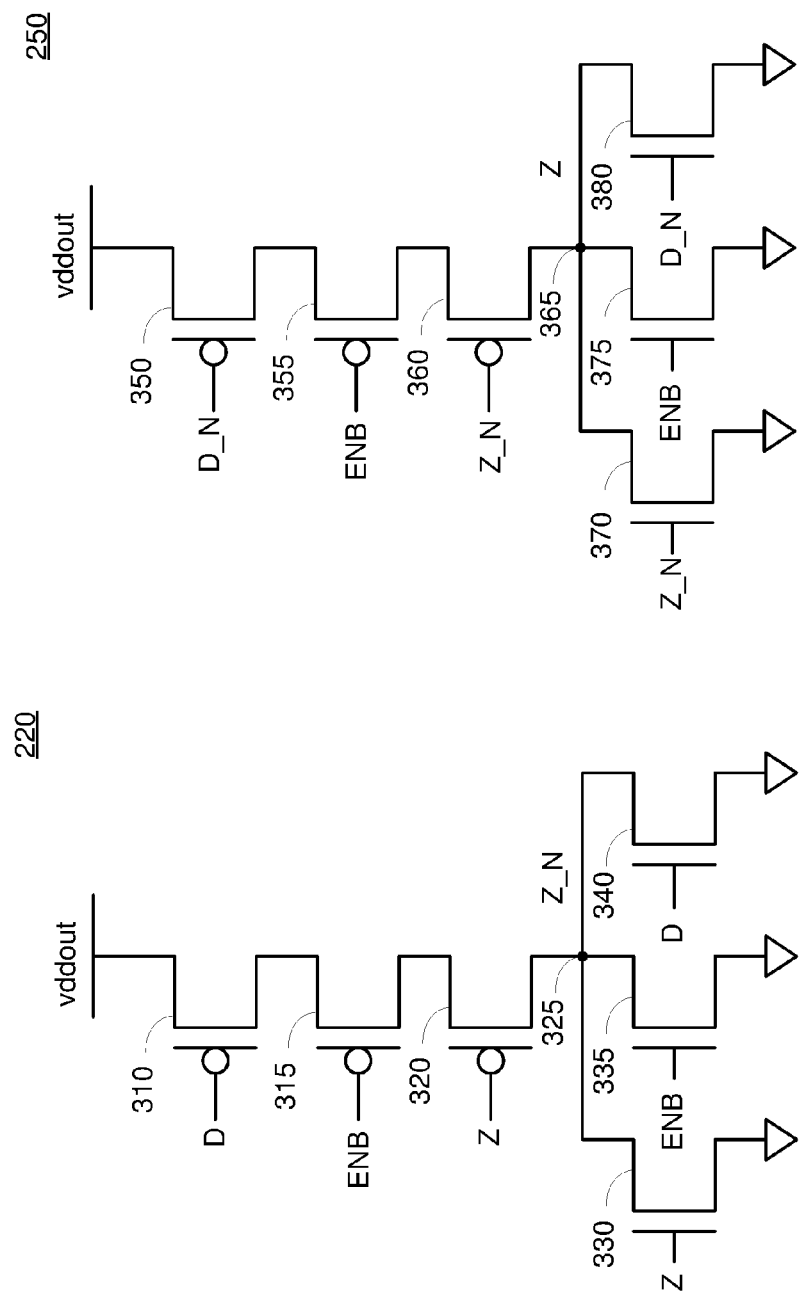
FIG. 3A shows an exemplary implementation of a first NOR gate according to certain aspects of the present disclosure.
FIG. 3B shows an exemplary implementation of a second NOR gate according to certain aspects of the present disclosure.

FIG. 3A shows an exemplary implementation of the first NOR gate 220 according to certain aspects. The first NOR gate 220 includes a stack of p-type metal-oxide-semiconductor (PMOS) transistors 310, 315 and 320 coupled in series between supply voltage vddout and output node 325. Each of the inputs 222, 225 and 227 of the first NOR gate 210 is coupled to the gate of a respective one of the PMOS transistors 310, 315 and 320 in the PMOS transistor stack. In the example shown in FIG. 3A, the gate of PMOS transistor 310 is coupled to the first input 222 to receive the input signal D, the gate of PMOS transistor 315 is coupled to the second input 225 to receive the enable signal ENB, and the gate of PMOS transistor 320 is coupled to the third input 227 to receive the output signal Z of the second NOR gate 250. However, it is to be appreciated that the present disclosure is not limited to this example.

The first NOR gate 220 also includes n-type metal-oxide-semiconductor (NMOS) transistors 330, 335 and 340 coupled in parallel between the output node 325 and ground. Each of the inputs 222, 225 and 227 of the first NOR gate 210 is coupled to the gate of a respective one of the parallel NMOS transistors 330, 335 and 340. In the example shown in FIG. 3A, the gate of NMOS transistor 330 is coupled to third input 227 to receive the output signal Z of the second NOR gate 250, the gate of NMOS transistor 335 is coupled to the second input 225 to receive the enable signal ENB, and the gate of NMOS transistor 340 is coupled to the first input 222 to receive the input signal D. However, it is to be appreciated that the present disclosure is not limited to this example. The output Z_N of the first NOR gate 220 is taken at the output node 325, as shown in FIG. 3A.

When the enable signal ENB is at logic one (i.e., ENB=1), the output Z_N of the first NOR gate 220 is discharged to zero. This is because the enable signal ENB turns off PMOS transistor 315, and turns on NMOS transistor 335, which allows NMOS transistor 335 to pull the output node 325 to ground.

As discussed above, the level shifter 210 is disabled when the enabled signal ENB is at logic one. Since the enable signal ENB is in the vddout domain, the voltage of the enable signal ENB is approximately equal to vddout when the enable signal ENB is at logic one. As a result, the enable signal ENB is able to fully turn off PMOS transistor 315, and therefore significantly reduce leakage current through the PMOS transistor stack when the level shifter 210 is disabled, thereby conserving power.

When the enable signal ENB is at logic zero (i.e., ENB=0), PMOS transistor 315 is turned on and NMOS transistor 335 is turned off. The logic value at the output Z_N of the first NOR gate 220 may be the inverse of the logic value of the input signal D.

For example, if the input data signal D is at logic one and the output signal Z of the second NOR gate 250 is at logic one, one or both PMOS transistors 310 and 320 may be turned off, and NMOS transistors 330 and 340 may be turned on. This allows NMOS transistors 330 and 340 to pull down the output Z_N to zero. In this example, the output signal Z of the second NOR gate 250 is in the vddout domain. As a result, the output signal Z is able to fully turn off PMOS transistor 320, and therefore significantly reduce DC current through the PMOS transistor stack even if the input signal D (which is in the vddin domain) is not able to fully turn off PMOS transistor 310.

If the input data signal D is at logic zero and the output signal Z of the second NOR gate 250 is at logic zero, PMOS transistors 310 and 320 may be turned on, and NMOS transistors 330 and 340 may be turned off. This allows PMOS transistors 310, 315 and 320 to pull up the output Z_N to one (i.e., pull up the voltage at the output Z_N to approximately vddout).

When the output Z_N of the first NOR gate 220 switches logic values, there may be a transient fight between PMOS transistors and NMOS transistors in the first NOR gate 220. For example, when the output Z_N of the first NOR gate 220 switches from one to zero, it may take time for PMOS transistors 310 and 320 to turn off. As a result, the PMOS transistors 310 and 320 may still be turned on when the NMOS transistor 330 and 340 initially turn on and attempt to pull the output Z_N to zero (ground). Therefore, PMOS transistors 310 and 320 may fight (resist) the attempt by the NMOS transistors 330 and 340 to pull the output Z_N to zero, slowing down the level shifter. As the difference between vddout and vddin increases, it may become increasing more difficult for the NMOS transistors to fight the PMOS transistors.

The stacked arrangement of the PMOS transistors 310, 315 and 320 in the first NOR gate 220 helps the NMOS transistors 330 and 340 fight the PMOS transistors 310, 315 and 320 during switching at the output Z_N. This is because the stacked arrangement weakens the strength of the PMOS transistors relative to the NMOS transistors, which are arranged in parallel. This reduces the need of having to increase the sizes of the NMOS transistors to strengthen the NMOS transistors relative to the PMOS transistors, thereby reducing the area of the level shifter 210. The weakening of the PMOS transistors may also increase the largest vddin to vddout difference that the level shifter 210 can support for reliable level shifting operation.

FIG. 3B shows an exemplary implementation of the second NOR gate 250 according to certain aspects. The second NOR gate 250 has a similar structure as the first NOR gate 220 discussed above. The second NOR gate 250 includes a stack of PMOS transistors 350, 355 and 360 coupled in series between supply voltage vddout and output node 365. Each of the inputs 252, 255 and 257 of the second NOR gate 250 is coupled to the gate of a respective one of the PMOS transistors 350, 355 and 350 in the PMOS transistor stack. In the example shown in FIG. 3B, the gate of PMOS transistor 350 is coupled to the first input 252 to receive the input signal D_N, the gate of PMOS transistor 355 is coupled to the second input 255 to receive the enable signal ENB, and the gate of PMOS transistor 360 is coupled to the third input 257 to receive the output signal Z_N of the first NOR gate 220. However, it is to be appreciated that the present disclosure is not limited to this example.

The second NOR gate 250 also includes NMOS transistors 370, 375 and 380 coupled in parallel between the output node 365 and ground. Each of the inputs 252, 255 and 257 of the second NOR gate 250 is coupled to the gate of a respective one of the parallel NMOS transistors 370, 375 and 380. In the example shown in FIG. 3B, the gate of NMOS transistor 370 is coupled to third input 257 to receive the output signal Z_N of the first NOR gate 220, the gate of NMOS transistor 375 is coupled to the second input 255 to receive the enable signal ENB, and the gate of NMOS transistor 360 is coupled to the first input 252 to receive the input signal D_N. However, it is to be appreciated that the present disclosure is not limited to this example. The output Z of the second NOR gate 250 is taken at the output node 365, as shown in FIG. 3B.

When the enable signal ENB is at logic one (i.e., ENB=1), the output Z of the first NOR gate 250 is discharged to zero. This is because the enable signal ENB turns off PMOS transistor 355, and turns on NMOS transistor 375, which allows NMOS transistor 375 to pull the output to ground. Since the enable signal ENB is in the vddout domain, the voltage of the enable signal ENB is approximately equal to vddout when the enable ENB is at logic one.

When the enable signal ENB is at logic zero (i.e., ENB=0), PMOS transistor 355 is turned on and NMOS transistor 375 is turned off. The logic value at the output Z of the second NOR gate 250 may be the inverse of the logic value of the input signal D_N. In other words, the logic value at the output Z may be the same as the logic value of the input signal D.

For example, if the input data signal D_N is at logic one and the output signal Z_N of the first NOR gate 220 is at logic one, one or both PMOS transistors 350 and 360 may be turned off, and NMOS transistors 370 and 380 may be turned on. This allows NMOS transistors 370 and 380 to pull down the output Z to zero. In this example, the output signal Z_N of the first NOR gate 220 is in the vddout domain.

If the input data signal D_N is at logic zero and the output signal Z_N of the first NOR gate 220 is at logic zero, PMOS transistors 350 and 360 may be turned on, and NMOS transistors 370 and 380 may be turned off. This allows PMOS transistors 350, 355 and 360 to pull up the output Z to one (i.e., pull up the voltage at the output Z to approximately vddout).

When the output Z of the second NOR gate 250 switches logic values, there may be a transient fight between PMOS transistors and NMOS transistors in the second NOR gate 250. The stacked arrangement of the PMOS transistors in the second NOR gate 250 helps the NMOS transistors fight the PMOS transistors during switching at the output Z for reasons similar to the reasons given above for the first NOR gate 220.

As discussed above, the first and second NOR gates 220 and 250 have similar structures. This provides the level shifter 210 with a symmetric structure that helps balance the rise and fall times at the outputs of the level shifter 210 (i.e., helps make the rise and fall times approximately the same). This advantageously reduces the amount of duty cycle distortion caused by the level shifter 210.

As discussed above, the level shifter 210 may be used to implement each of the level shifters 140-1 to 140-8 shown in FIG. 1. In this regard, the level shifter 210 may be coupled to the output of one of the registers 115-1 to 115-8 shown in FIG. 1. For example, the first input 222 of the first NOR 220 may be coupled to the output of the respective register and the first input 252 of the second NOR gate 250 may be coupled to the output of the respective register via an inverter in the vddin domain. The output Z of the second NOR gate 250 may be coupled to the second FIFO 160. Alternatively, the output Z_N of the first NOR gate 220 may be coupled to the second FIFO 160 via an inverter in the vddout domain.

In one example, the decoder 170 may generate the enable signal ENB in the vddout domain. In this example, the decoder 170 may cause the enable signal ENB to be logic one (i.e., ENB=1) when the respective register is not selected. In this case, the outputs of the first and second NOR gates 220 and 250 are discharged to zero.

When the respective register is later selected (addressed by the address signal discussed above), the decoder 170 causes the enable signal ENB to change (transition) from one to zero to enable the level shifter 210. The data signals D and D_N may be applied to the inputs 222 and 252 of the first and second NOR gates 220 and 250, respectively, prior to the enable signal ENB changing from one to zero. When the enable signal ENB changes from one to zero, one of the outputs Z and Z_N of the level shifter 210 changes (transitions) from zero to one depending on the logic value of the input data signal D. The other one of the outputs Z and Z_N stays at logic zero. For example, if the input data signal D has a logic value of one, then the output Z changes from zero to one, while the output Z_N stays at zero. If the input data signal D has a logic value of zero (i.e., input data signal D_N has a logic value of one), then the output Z_N changes from zero to one, while the output Z stays at zero.

It is to be appreciated that the level shifter 210 is not limited to the above example, and may be used in other applications requiring voltage level shifting to allow a signal to cross from a lower power domain to a higher power domain. For example, the input signals D and D_N may be read out of another type of buffer in the vddin domain besides a FIFO in the vddin domain. In general, the input data signals D and D_N may be provided by a circuit (e.g., driver, processor, memory, etc.) in the vddin domain, in which the circuit is powered by the supply voltage vddin.

Figure 4:
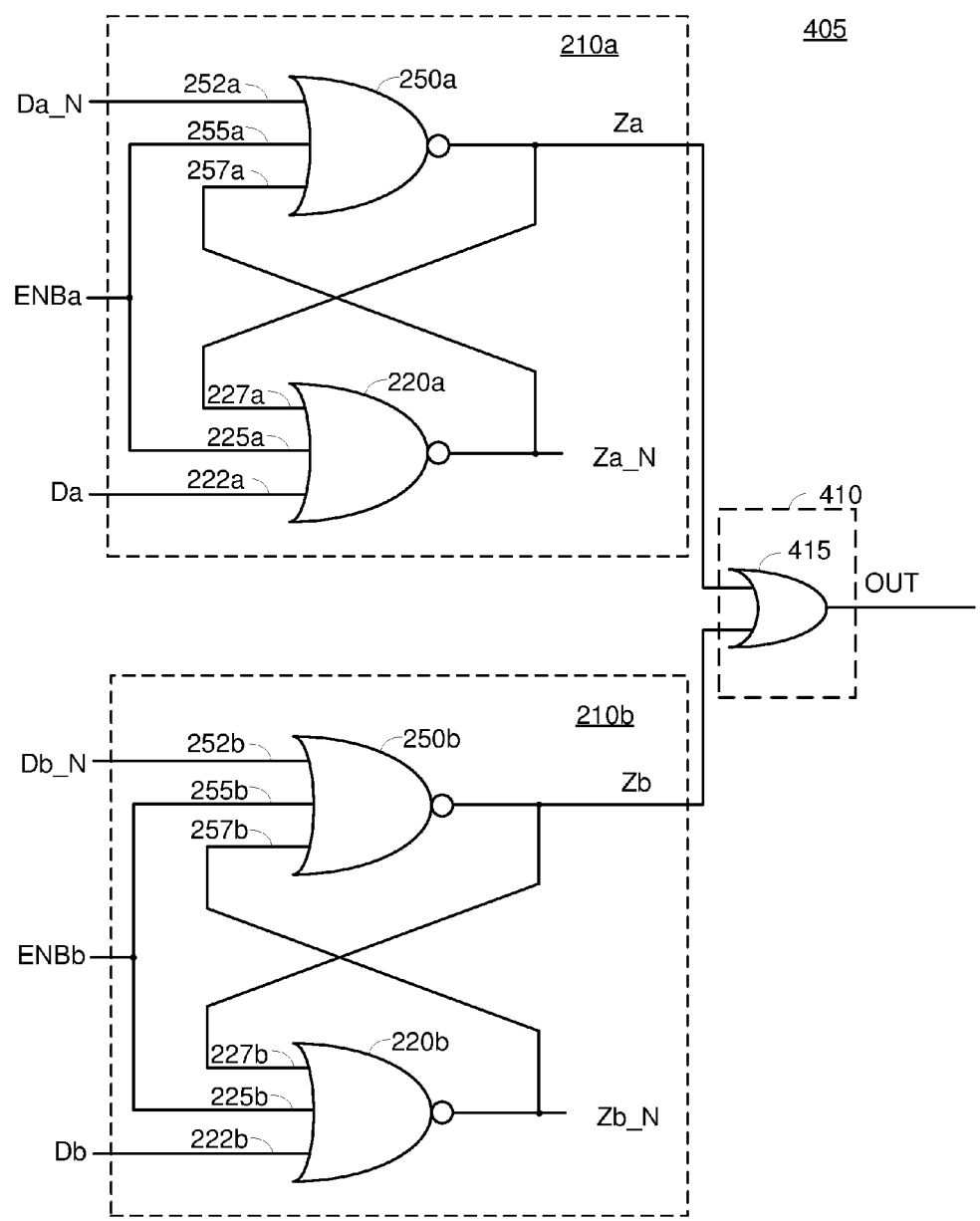
FIG. 4 shows an example of a level-shifting multiplexer according to certain aspects of the present disclosure.

In certain aspects, the level shifter 210 may be duplicated and used to form a level-shifting multiplexer. In this regard, FIG. 4 shows an example of a level-shifting multiplexer 405 including a first level shifter 210a, a second level shifter 210a, and a combiner 410. Each of the level shifters 210a and 210b may be implemented using the level shifter 210 shown in FIG. 2. In FIG. 4, the components of the first level shifter 210a are identified with the suffix "a" and the components of the second level shifter 210b are identified with the suffix "b".

In this example, the first level shifter 210a receives a first input data signal Da and its complement Da_N, and the second level shifter 210b receives a second input data signal Db and its complement Db_N. For example, the first and second level shifters 210a and 210b may be coupled to different outputs of the first FIFO 110 shown in FIG. 1. The first level shifter 210a also receives a first enable signal ENBa, and the second level shifter 210b also receives a second enable signal ENBb. The combiner 410 has a first input coupled to output Za of the first level shifter 210a, a second input coupled to output Zb of the second level shifter 210b, and an output (denoted "OUT") providing the output of the level-shifting multiplexer 405.

The level-shifting multiplexer 405 is configured to select the input signals of one of the level shifters 210a and 210b according to the logic values of the first and second enable signals ENBa and ENBa. The level-shifting multiplexer 405 is also configured to voltage level shift the input signals of the selected level shifter, and output one of the level-shifted output signals of the selected level shifter.

For example, if the first level shifter 210a is selected, then the first enable signal ENBa is zero, and the second enable signal ENBb is one. In this case, the first level shifter 210a is enabled, and the second level shifter 210b is disabled. The first level shifter 210a outputs level-shifted output signal Za to the combiner 410, in which the level-shifted output signal Za has the same logic value as input data signal Da, but in the vddout domain. In this case, the combiner 410 outputs the level-shifted output signal Za at the output (denoted "OUT").

If the second level shifter 210b is selected, then the second enable signal ENBb is zero, and the first enable signal ENBa is one. In this case, the second level shifter 210b is enabled, and the first level shifter 210a is disabled. The second level shifter 210b outputs level-shifted output signal Zb to the combiner 410, in which the level-shifted output signal Zb has the same logic value as input data signal Db, but in the vddout domain. In this case, the combiner 410 outputs the level-shifted output signal Zb at the output (denoted "OUT").

In the example shown in FIG. 4, the combiner 410 may be implemented with an OR gate 415 having a first input coupled to output Za of the first level shifter 210a, a second input coupled to output Zb of the second level shifter 210b, and an output (denoted "OUT") providing the output of the level-shifting multiplexer 405. In this example, the OR gate 415 outputs the level-shifted output signal of the selected one of the level shifters 210a and 210b. This is because the output of the unselected level shifter (disabled level shifter) coupled to the OR gate 415 is at logic zero. As a result, the logic value at the output of the OR gate 415 tracks the logic value of the level-shifted output signal of the selected level shifter.

It is to be appreciated that the level-shifting multiplexer 405 is not limited to the example shown in FIG. 4. For example, it is to be appreciated that the combiner 410 may be implemented with other logic that outputs the level-shifted output signal of the selected (enabled) one of the level shifters.

Although two level shifters are shown in the example in FIG. 4 for ease of illustration, it is to be appreciated that the level-shifting multiplexer 405 may include any number of level shifters. For example, the level-shifting multiplexer 405 may be used to implement the level shifters 140-1 to 140-8 and multiplexer 150 shown in FIG. 1. In this example, the level-shifting multiplexer 405 may include a level shifter for each output of the first FIFO 110 shown in FIG. 1, in which one of the inputs of each level shifter is coupled to the respective output of the first FIFO 110, and the output of each level shifter is input to the combiner 410. The other input of each level shifter may be coupled to the respective output of the first FIFO 110 via an inverter. Also, in this example, the output (denoted "OUT") of the level-shifting multiplexer 405 may be coupled to the second FIFO 160.

In this example, the decoder 170 may be configured to generate the enable signals for the level shifters in the vddout domain according to the address signal, in which the enable signal of the level shifter corresponding to the selected (addressed) register 115-1 to 115-8 is zero, and the enable signals of the other level shifters are all one. In other words, the decoder 170 selects one of the registers 115-1 to 115-8 according to the address signal (denoted "raddr") by causing the enable signal of the respective level shifter to be zero to enable the respective level shifter, and causing the enable signals of the other level shifters to all be one to disable the other level shifters.

Figure 5:
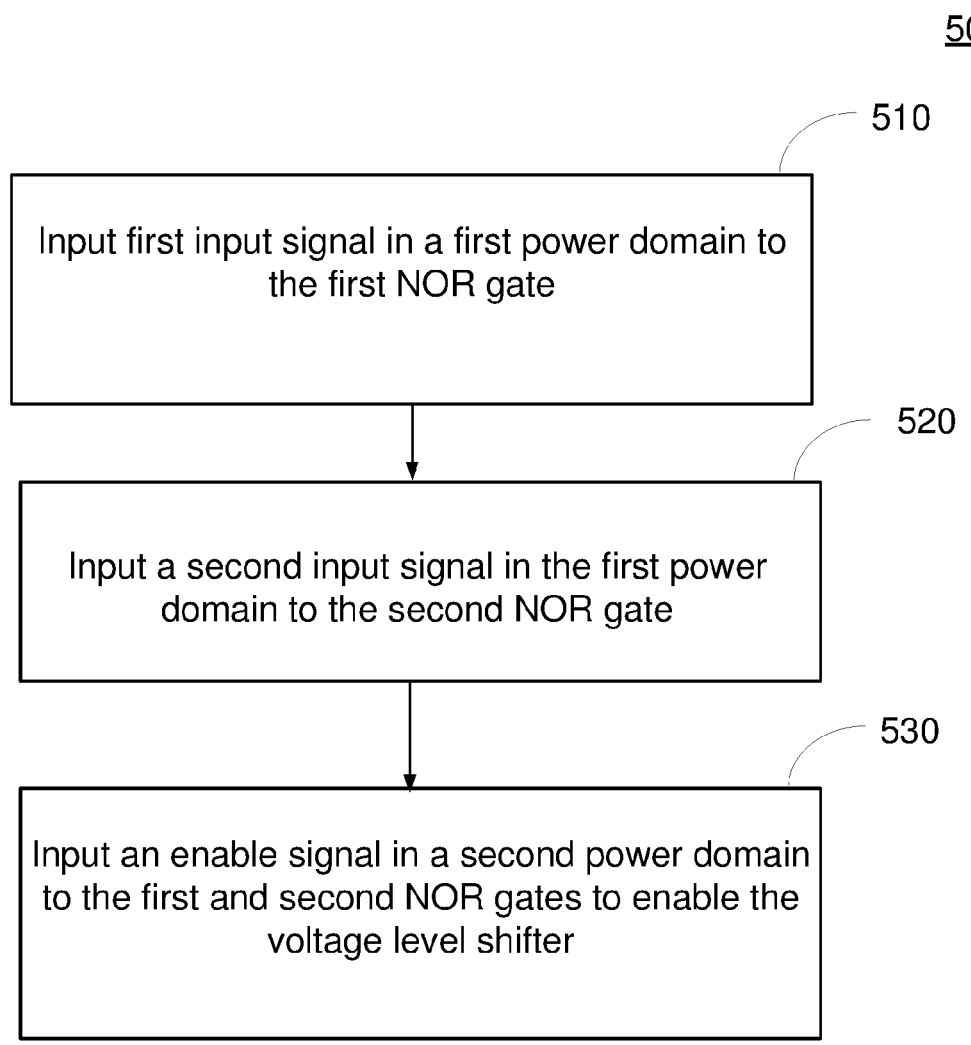
FIG. 5 is a flowchart illustrating a method for performing voltage level shifting according to certain aspects of the present disclosure.

FIG. 5 is a flowchart illustrating a method 500 for performing voltage level shifting using a voltage level shifter (e.g., the level shifter 210) according to certain aspects. The voltage level shifter includes first and second cross-coupled NOR gates (e.g., first and second NOR gates 220 and 250).

In step 510, a first input signal in a first power domain is input to the first NOR gate. For example, the first input signal may correspond to input signal D and the first power domain may correspond to the vddin domain.

In step 520, a second input signal in the first power domain is input to the second NOR gate. For example, the second input signal may correspond to input signal D_N and the first power domain may correspond to the vddin domain. The second input signal may be the complement of the first input signal.

In step 530, an enable signal in a second power domain is input to the first and second NOR gates to enable the voltage level shifter. For example, the enable signal may correspond to enable signal ENB and the second power domain may correspond to the vddout domain. The second power domain may be higher than the first power domain. Also, the enable signal may have a voltage range (e.g., vddout) that is greater than the voltage range (e.g., vddin) of the first and second input signals. Further, the first and second NOR gates may be powered by a supply voltage (e.g., vddout) of the second power domain so that the outputs of the first and second NOR gates are in the second power domain.

Figure 6:
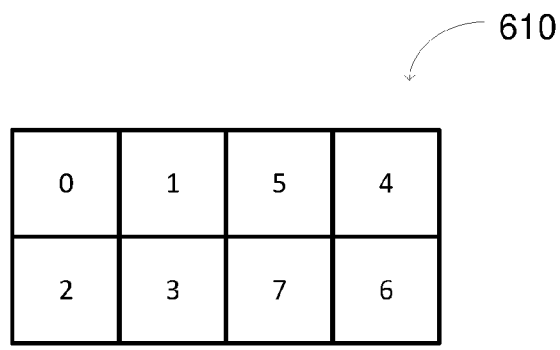
FIG. 6 shows an example of a tray of level shifters according to certain aspects of the present disclosure.

In certain aspects, a large number of signals may cross from one power domain to another power domain, in which each signal requires voltage level shifting. In this case, instead of using a single-bit level shifter for each signal, it may be beneficial to use a tray of level shifters for a set of signals. For example, an 8-bit tray of level shifters may be used to level shift eight signals in one cell. In this regard, FIG. 6 shows a block diagram of a cell 610 including a tray of eight level shifters (numbered zero to seven), in which each level shifter may be implemented using the level shifter in FIG. 2.

Figure 7:
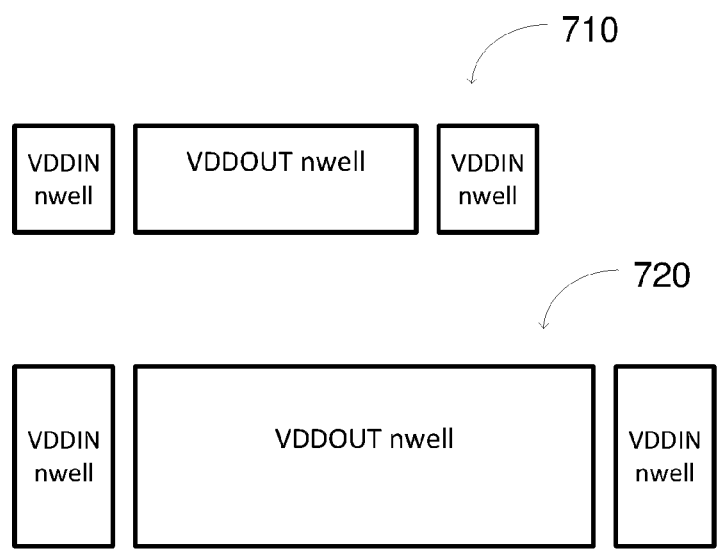
FIG. 7 shows an example of nwell-to-nwell boundaries for a single-bit level shifter and a tray of level shifters according to certain aspects of the present disclosure.

Using a tray of level shifters reduces area per bit compared to a single-bit level shifter owing to the ability to share common signals (e.g., enables, clamps, etc.) as well as the ability to reduce the number of nwell-to-nwell boundaries required. In this regard, FIG. 7 shows an example of nwell boundaries for a single-bit level shifter 710 and a tray of level shifters 720. As shown in FIG. 7, the tray of level shifters has the same number of nwell separations, allowing for a reduction in area by combining all of the transistors from the different level shifters that belong to the same voltage domain in a single nwell corresponding to that domain. Embodiments of the present disclosure allow for an area efficient implementation of a tray level shifter (e.g., 25% area reduction) compared to conventional level shifters.

Figure 8:
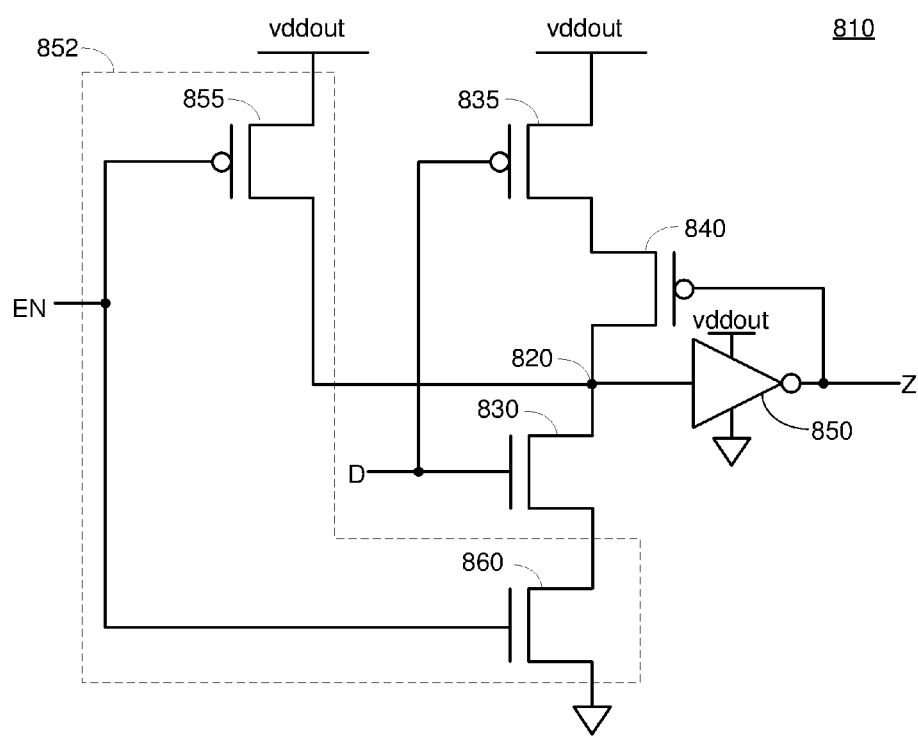
FIG. 8 shows another exemplary voltage level shifter according to certain aspects of the present disclosure.

FIG. 8 shows another exemplary level shifter 810 according to certain aspects of the present disclosure. The level shifter 810 is configured to level shift the voltage of an input signal D from a lower power domain (lower voltage domain) to a higher power domain (higher voltage domain), and may be used to implement each of the level shifters 140-1 to 140-8 shown in FIG. 1. The lower power domain has a supply voltage of vddin and the higher power domain has a supply voltage of vddout. In the discussion below, the lower power domain is referred to as the vddin domain, and the higher power domain is referred to as the vddout domain.

The level shifter 810 includes a first PMOS transistor 835 and a second PMOS transistor 840 coupled in series between supply voltage vddout and node 820. Because the first PMOS transistor 835 and the second PMOS transistor 840 are coupled in series, they form a conduction path between the supply rail of the supply voltage vddout and node 820 when both are turned on. The conduction path is block if one or both of the first PMOS transistor 835 and the second PMOS transistor 840 are turned off.

The gate of the first PMOS transistor 135 is configured to receive the input signal D from a circuit (e.g., FIFO 110) in the vddin domain. The input signal D has a voltage range of approximately Vddin. The level shifter 810 further includes an inverter 850 having an input coupled to node 820 and an output coupled to the output of the level shifter (denoted "Z") and the gate of the second PMOS transistor 840. The inverter 850 is powered in the vddout domain so that the output Z of the level shifter 810 has a voltage range of approximately vddout, as discussed below.

The level shifter 810 further includes a first NMOS transistor 830, and an enable circuit 852. The first NMOS transistor 830 has a gate configured to receive the input signal D, a drain coupled to node 820, and a source coupled to the enable circuit 852. As discussed further below, the enable circuit 852 is configured to couple the source of the first NMOS transistor 830 to ground when the voltage level shifter 810 is enabled and to decouple the source of the first NMOS transistor 830 from ground when the voltage level shifter 810 is disabled.

In the example shown in FIG. 8, the enable circuit 852 includes a third PMOS transistor 855 and a second NMOS transistor 860. The third PMOS transistor 855 has a source coupled to supply voltage vddout, a gate configured to receive an enable signal (denoted "EN") in the vddout domain, and a drain coupled to node 820. The enable signal EN has a voltage range of approximately vddout, as discussed further below. The second NMOS transistor 860 is coupled in series with the first NMOS transistor 830. In the example in FIG. 8, the first and second NMOS transistors 830 and 860 are coupled in series between node 820 and ground. The gate of the second NMOS transistor 860 is configured to receive the enable signal EN in the vddout domain. Because the first NMOS transistor 830 and the second NMOS transistor 860 are coupled in series, they form a conduction path between node 820 and ground when both are turned on. The conduction path is block if one or both of the first NMOS transistor 830 and the second NMOS transistor 860 are turned off.

In operation, the logic state of the enable signal EN controls whether the level shifter 810 is enabled or disabled. More particularly, the level shifter 810 is disabled when the enable signal EN is logic zero (i.e., EN=0). The level shifter 810 is enabled when the enable signal EN is logic one (i.e., EN=1), which corresponds to a voltage of approximately vddout since the enable signal EN is in the vddout domain.

When the enable signal is zero, the second NMOS transistor 860 is turned off and the third PMOS transistor 855 is turned on. As a result, the second NMOS transistor 860 decouples the source of the first NMOS transistor 830 from ground, and the third PMOS transistor 855 couples node 820 to the supply voltage vddout, thereby pulling up node 820 to the supply voltage vddout. Thus, node 820 is precharged to vddout, which corresponds to a logic one in the vddout domain. The logic one at node 820 (which is coupled to the input of the inverter 850) causes the inverter 850 to output a logic zero at the output Z of the level shifter 810. In this case, the output Z stays at logic zero while the level shifter 810 is disabled regardless (independent) of the logic state of the input signal D. The logic zero at the output Z turns on the second PMOS transistor 840.

Figure 9:
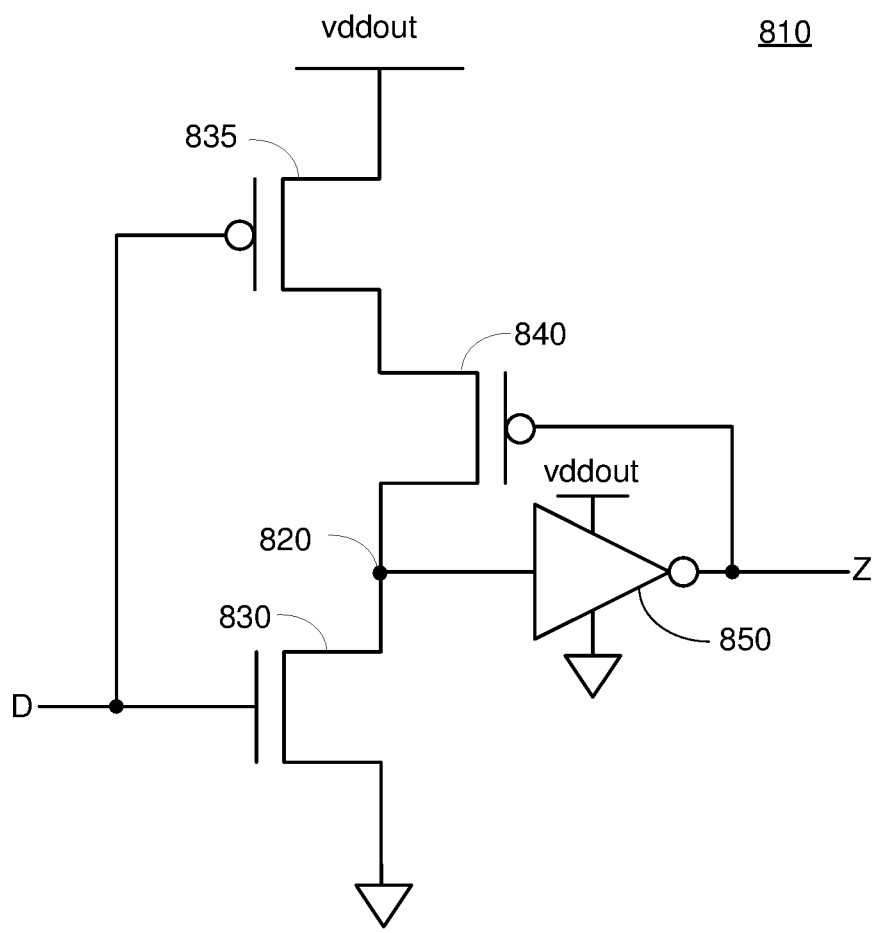
FIG. 9 shows a circuit level equivalent of the voltage level shifter in FIG. 8 when the voltage level shifter is enabled according to certain aspects of the present disclosure.

When the enable signal EN is one, the second NMOS transistor 860 is turned on. As a result, the second NMOS transistor 860 couples the source of the first NMOS transistor 830 to ground. In addition, the third PMOS transistor 855 is turned off. Since the enable signal EN is in the vddout domain, the enable signal EN is able to completely turn off the third PMOS transistor 855 (i.e., the third PMOS transistor 855 is not partially on). FIG. 9 shows the circuit level equivalent of the level shifter 810 when the enable signal EN is one. As shown in FIG. 9, the drain of the first NMOS transistor 830 is coupled to node 820 and the source of the first NMOS transistor 830 is coupled to ground when the level shifter 810 is enabled.

When the enable signal EN changes from zero to one (i.e., when the level shifter 810 is first enabled), node 820 is initially at vddout (logic one). This is because node 820 is precharged to the supply voltage vddout, as discussed above.

If the input signal D is logic zero, then the first NMOS transistor 830 is turned off and the first PMOS transistor 835 is turned on. As a result, the voltage at node 820 remains at approximately vddout, which corresponds to logic one in the vddout domain. The logic one at node 820 causes the output of the inverter 850 to remain at logic zero, and hence the second PMOS transistor 840 to remain turned on. Thus, node 820 stays at logic one and the output Z stays at logic zero when the input signal D is logic zero.

If the input D is logic one, then the first NMOS transistor 830 is turned on and the first PMOS transistor 835 is partially turned off. The reason the first PMOS transistor 835 is only partially turned off (partially turned on) is because the input signal D is in the vddin domain, which is lower than the vddout domain.

The first NMOS transistor 830 (which is turned on) discharges node 820, causing the voltage at node 820 to drop from vddout. During this time, the first NMOS transistor 830 may have to fight the first PMOS transistor 835 to pull down node 820 because the first PMOS transistor 835 is still partially turned on, as discussed above. Eventually the voltage at node 820 becomes low enough to flip the output state of the inverter 850 from zero to one (and hence the output Z of the level shifter 810 to flip from zero to one). This causes the second PMOS transistor 840 to turn off. Turning off the second PMOS transistor 840 significantly reduces the flight between the first PMOS transistor 835 and the first NMOS transistor 830 by blocking the conduction path between the first PMOS transistor 835 and node 820. This makes it easier for the first NMOS transistor 830 to pull node 820 to approximately ground. Turning off the second PMOS transistor 840 also has the benefit of reducing leakage current that would otherwise flow through the level shifter 810 because the first PMOS transistor 835 is only partially turned off by the input signal D. Thus, when the input signal D is logic one, the output Z of the level shifter 810 changes from logic zero to logic one.

In summary, when the voltage level shifter 810 is disabled (i.e., EN=0), node 820 is precharged to vddout (logic one in the vddout domain) and the output Z is at logic zero. When the voltage level shifter 810 is enabled (e.g., EN=1), the output Z of the voltage level shifter 810 either stays at zero or transitions to one depending on the logic value of the input signal D. More particularly, the output Z stays at zero when the input signal D is at logic zero, and transitions from zero to one when the input signal D is at logic one. The level-shifted signal at the output Z may be output to one or more circuits in the vddout domain for further processing.

The voltage level shifter 810 does not need the complement (inverse) of the input signal D in order to level shift the input signal D. This eliminates the need for a circuit (e.g., inverter) in the vddin domain to generate the complement of the input signal D. This also reduces the number of transistors in the voltage level shifter 810 (and hence the area of the voltage level shifter 810) compared with other level-shifting designs that receive complementary input signals in the vddin domain.

As discussed above, the level shifter 810 may be used to implement each of the level shifters 140-1 to 140-8 shown in FIG. 1. In this regard, the level shifter 810 may be coupled to the output of one of the registers 115-1 to 115-8 shown in FIG. 1. For example, if the level shifter 810 implements level shifter 140-1 shown in FIG. 1, then the level shifter 810 is coupled to the output of register 115-1, and receives the input signal D from register 115-1. The output of the level shifter 810 may be coupled to the second FIFO 160 in the vddout domain.

In this example, the decoder 170 may generate the enable signal EN in the vddout domain based on the read address signal. For instance, the decoder 170 may set the enable signal EN to logic zero (i.e., ENB=0) when the respective register is not addressed (selected) by the address signal. In this case, the voltage level shifter 810 is disabled. As a result, node 820 is precharged to vddout (logic one in the vddout domain) and the output Z is at logic zero.

When the respective register is addressed (selected) by the address signal, the decoder 170 causes the enable signal EN to change (transition) from zero to one to enable the level shifter 810. The input signal D may be applied to the input of the level shifter 810 (i.e., gates of the first PMOS transistor 835 and first NMOS transistor 830) prior to the decoder 170 changing the enable signal EN from zero to one. This helps ensure that the input signal D is stable when the voltage level shifter 810 is enabled.

When the voltage level shifter 810 is enabled, the output Z of the level shifter 810 either stays at logic zero or changes from logic zero to logic one depending on the logic value of the input signal D. For example, if the input signal D has a logic value of zero, then node 820 stays precharged at vddout (logic one in the vddout domain) and the output Z stays at logic zero. If the input signal D has a logic value of one, then node 820 is discharged and the output Z transitions from logic zero to logic one.

It is to be appreciated that the level shifter 810 is not limited to the above example, and may be used in other applications requiring voltage level shifting to allow a signal to cross from a lower power domain to a higher power domain. For example, the input signal D may be read out of another type of buffer in the vddin domain besides a FIFO in the vddin domain. In general, the input data signal D may be provided by a circuit (e.g., driver, processor, memory, etc.) in the vddin domain, in which the circuit is powered by the supply voltage vddin.

Figure 10:
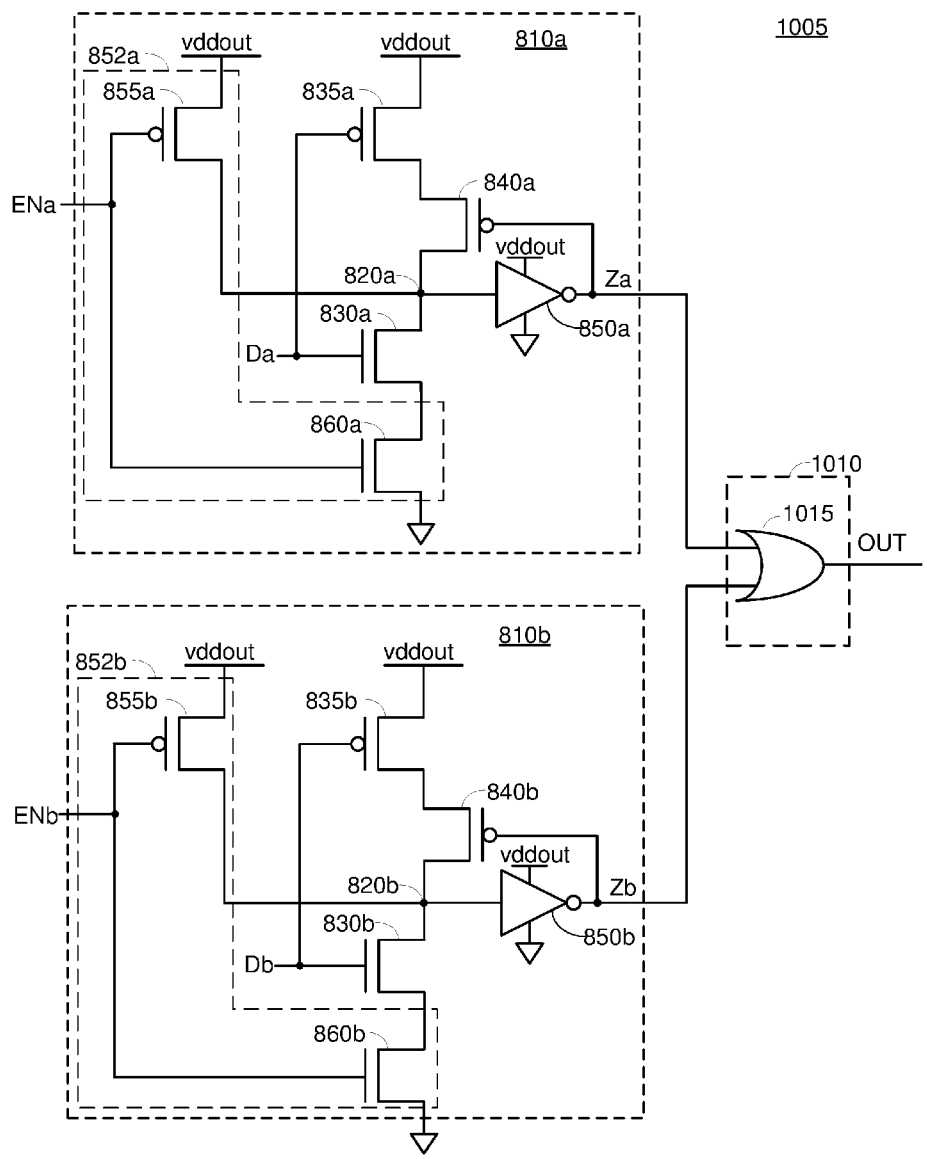
FIG. 10 shows another example of a level-shifting multiplexer according to certain aspects of the present disclosure.

In certain aspects, the level shifter 810 may be duplicated and used to form a level-shifting multiplexer. In this regard, FIG. 10 shows an example of a level-shifting multiplexer 1005 including a first level shifter 810a, a second level shifter 810a, and a combiner 1010. Each of the level shifters 810a and 810b is a duplicate of the level shifter 810 shown in FIG. 8. In FIG. 10, the components of the first level shifter 810a are identified with the suffix "a" and the components of the second level shifter 810b are identified with the suffix "b".

In this example, the first level shifter 810a receives a first input signal Da in the vddin domain, and the second level shifter 810b receives a second input signal Db in the vddin domain. For example, the first and second level shifters 810a and 810b may be coupled to different outputs of the first FIFO 110 shown in FIG. 1. The first level shifter 810a also receives a first enable signal ENa in the vddout domain, and the second level shifter 810b also receives a second enable signal ENb in the vddout domain. The combiner 410 has a first input coupled to the output Za of the first level shifter 810a, a second input coupled to the output Zb of the second level shifter 810b, and an output (denoted "OUT") that provides the output of the level-shifting multiplexer 1005. The output OUT may be coupled to the second FIFO 160 shown in FIG. 1.

The level-shifting multiplexer 1005 is configured to select the input signal of one of the level shifters 810a and 810b according to the logic values of the first and second enable signals ENa and ENb. The level-shifting multiplexer 1005 is also configured to voltage level shift the selected input signal from the vddin domain to the vddout domain, and output the resulting level-shifted signal at the output OUT, as discussed further below.

For example, the first level shifter 810a is selected by setting the first enable signal ENa at logic one, and setting the second enable signal ENb at logic zero. In this case, the first level shifter 810a is enabled, and the second level shifter 810b is disabled. The first level shifter 810a level shifts the first input signal Da to produce level-shifted output signal Za. The combiner 1010 receives the level-shifted output signal Za, and outputs the level-shifted output signal Za at the output OUT of the multiplexer 1005.

The second level shifter 810a is selected by setting the second enable signal ENb to logic one, and setting the first enable signal ENa to logic zero. In this case, the second level shifter 810b is enabled, and the first level shifter 810a is disabled. The second level shifter 810b level shifts the second input signal Db to produce level-shifted output signal Zb. The combiner 1010 receives the level-shifted output signal Zb, and outputs the level-shifted output signal Zb at the output OUT of the multiplexer 1005.

In the example shown in FIG. 10, the combiner 1010 may be implemented with an OR gate 1015 having a first input coupled to the output Za of the first level shifter 810a, a second input coupled to the output Zb of the second level shifter 810b, and an output providing the output OUT of the level-shifting multiplexer 1005. In this example, the OR gate 1015 outputs the level-shifted output signal of the selected one of the level shifters 810a and 810b (enabled level shifter). This is because the output of the unselected level shifter (disabled level shifter) is at logic zero, which is input to the OR gate 1015. The logic zero from the unselected level shifter causes the output of the OR gate 1015 to track the logic value of the level-shifted output signal of the selected level shifter.

It is to be appreciated that the level-shifting multiplexer 1005 is not limited to the example shown in FIG. 10. For example, it is to be appreciated that the combiner 1010 may be implemented with other logic that outputs the level-shifted output signal of the selected (enabled) one of the level shifters.

Although two level shifters are shown in the example in FIG. 10 for ease of illustration, it is to be appreciated that the level-shifting multiplexer 1005 may include any number of level shifters. For example, the level-shifting multiplexer 1005 may be used to implement the level shifters 140-1 to 140-8 and multiplexer 150 shown in FIG. 1. In this example, the level-shifting multiplexer 1005 may include a level shifter for each output (register) of the first FIFO 110 shown in FIG. 1, in which each level shifter is a duplicate of the level shifter 810 shown in FIG. 8. The input of each level shifter is coupled to the respective output (register) of the first FIFO 110, and the output of each level shifter is input to the combiner 1010 (e.g., OR gate 1015). The combiner 1010 outputs the level-shifted output signal of the selected one of the level shifters at the output OUT of the multiplexer, which may be coupled to the second FIFO 160 shown in FIG. 1.

In this example, the decoder 170 may be configured to generate the enable signals for the level shifters in the vddout domain based on the address signal. More particularly, when the address signal addresses a particular one of the registers 115-1 to 115-8 in the first FIFO 110, the decoder 170 enables (selects) the level shifter corresponding to the addressed register, and disables the other level shifters. To do this, the decoder 170 may set the enable signal of the corresponding level shifter to logic one and set the enable signal of each of the other level shifters to logic zero. The enabled (selected) level shifter level shifts the input signal from the addressed register and outputs the resulting level-shifted signal to the combiner 1010 (e.g., OR gate 1015), which outputs the level-shifted signal at the output OUT of the multiplexer.

Figure 11:
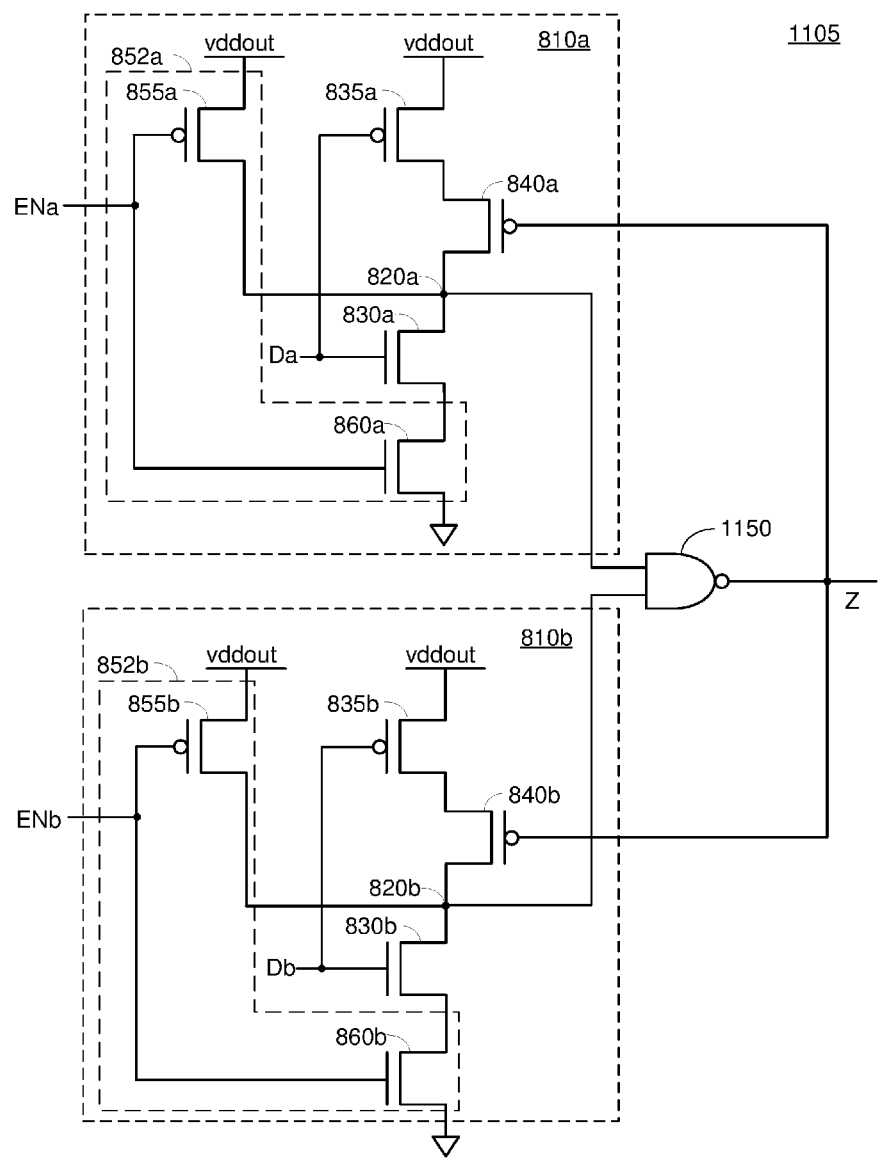
FIG. 11 shows still another example of a level-shifting multiplexer according to certain aspects of the present disclosure.

FIG. 11 shows another example of a level-shifting multiplexer 1105 according to certain aspects of the present disclosure. The level-shifting multiplexer 1105 in FIG. 11 is similar to the level-shifting multiplexer 1005 in FIG. 10 except that the functions of the inverters in the level shifters 810a and 810b and functions of the combiner 1010 are performed by a NAND gate 1150, as discussed further below.

The NAND gate 1150 has a first input coupled to node 820a of the first level shifter 810a, a second input coupled to node 820b of the second level shifter 810b, and an output Z that provides the output for the multiplexer 1105. The output Z of the NAND gate 1150 is also coupled to the gate of the second PMOS transistor 840a of the first level shifter 810a and the gate of the second PMOS transistor 840b of the second level shifter 810b, as shown in FIG. 11.

The level-shifting multiplexer 1105 is configured to select the input signal of one of the level shifters 810a and 810b according to the logic values of the first and second enable signals ENa and ENb.

For example, the first level shifter 810a is selected by setting the first enable signal ENa at logic one, and setting the second enable signal ENb at logic zero. In this case, the first level shifter 810a is enabled, and the second level shifter 810b is disabled. Because the second level shifter 810b is disabled, node 820b of the second level shifter 810b is precharged to logic one, which is input to the NAND gate 1150. The logic one from the second level shifter 810b causes the NAND gate 1150 to function as an inverter for the first level shifter 810a having an input coupled to node 820a of the first level shifter 810a, and an output coupled to the gate of the second PMOS transistor 840a of the first level shifter 810a. In other words, the NAND gate 1150 functions as inverter 850a shown in FIG. 10. In this case, the multiplexer level shifts the first input signal Da, and outputs the resulting level-shifted signal at output Z.

The second level shifter 810b is selected by setting the second enable signal ENb at logic one, and setting the first enable signal ENa at logic zero one. In this case, the second level shifter 810b is enabled, and the first level shifter 810a is disabled. Because the first level shifter 810a is disabled, node 820a of the first level shifter 810a is precharged to logic one, which is input to the NAND gate 1150. The logic one from the first level shifter 810a causes the NAND gate 1150 to function as an inverter for the second level shifter 810b having an input coupled to node 820b of the second level shifter 810b, and an output coupled to the gate of the second PMOS transistor 840b of the second level shifter 810b. In other words, the NAND gate 1150 functions as inverter 850b shown in FIG. 10. In this case, the multiplexer level shifts the second input signal Db, and outputs the resulting level-shifted signal at output Z.

Although two level shifters are shown in the example in FIG. 11 for ease of illustration, it is to be appreciated that the level-shifting multiplexer 1105 may be extended to any number of level shifters. This may be done by coupling node 820 of each of the level shifters to a respective input of the NAND gate 1150 and coupling the output of the NAND gate 1150 to the gate of the second PMOS transistor 840 of each of the level shifters. Assuming that one of the level shifters is enabled (selected) at a time, the NAND gate 1150 functions as the inverter 850 for the enabled level shifter and outputs the level-shifted signal for the enabled level shifter.

Figure 12:
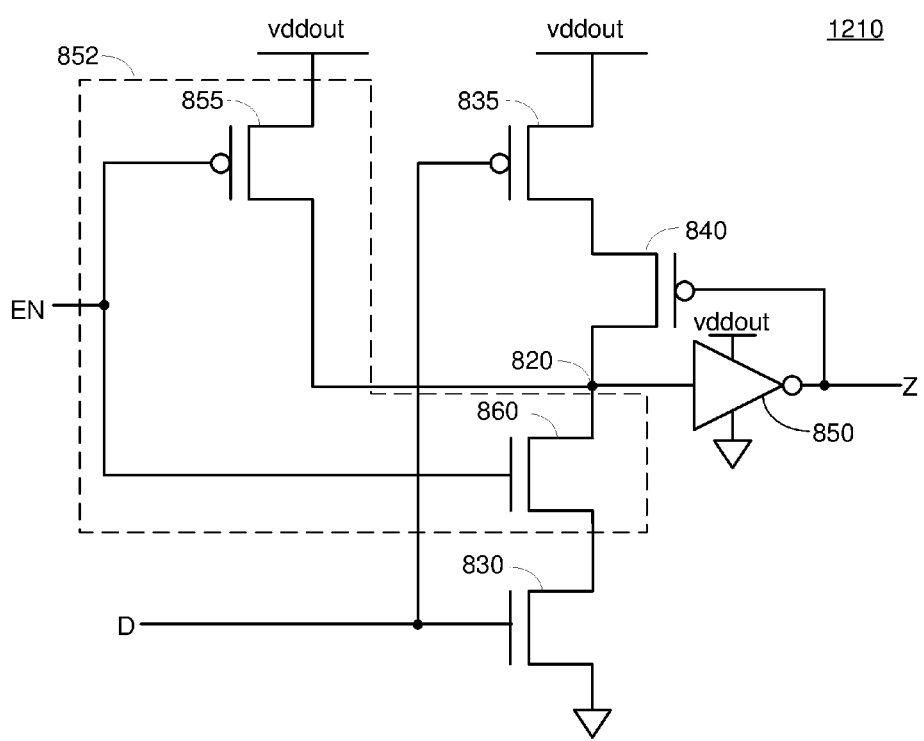
FIG. 12 shows still another exemplary voltage level shifter according to certain aspects of the present disclosure.

It is to be appreciated that the arrangement of the first NMOS transistor 830 and the second NMOS transistor 860 shown in FIG. 8 is exemplary only, and that the arrangement of the first NMOS transistor 830 and the second NMOS transistor 860 may be reversed. In this example, FIG. 12 shows an example of a level shifter 1210 in which arrangement of the first NMOS transistor 830 and the second NMOS transistor 860 shown in FIG. 8 is reversed. In this example, the drain of the second NMOS transistor 860 is coupled to node 820, the drain of the first NMOS transistor 830 is coupled to the source of the second NMOS transistor 860, and the source of the first NMOS transistor 830 is coupled to ground. The first and second NMOS transistor 830 and 860 are still coupled in series between node 820 and ground.

In this example, when the enable signal EN is logic zero, the second NMOS transistor 860 is turned off, and therefore decouples the drain of the first NMOS transistor 830 from node 820. This blocks the conduction path from node 820 to ground, allowing the third PMOS transistor 855 to precharge node 820 to vddout, same as before. When the enable signal EN is logic one, the second NMOS transistor 860 is turned on, and therefore couples the drain of the first NMOS transistor 830 to node 820. As a result, the first NMOS transistor 830 is coupled between node 820 and ground, same as before. Thus, the level shifter 1210 functions substantially the same as the level shifter 810 in FIG. 8, and may be used to implement the level-shifting multiplexers 1005 and 1105 shown in FIGS. 10 and 11.

Figure 13:
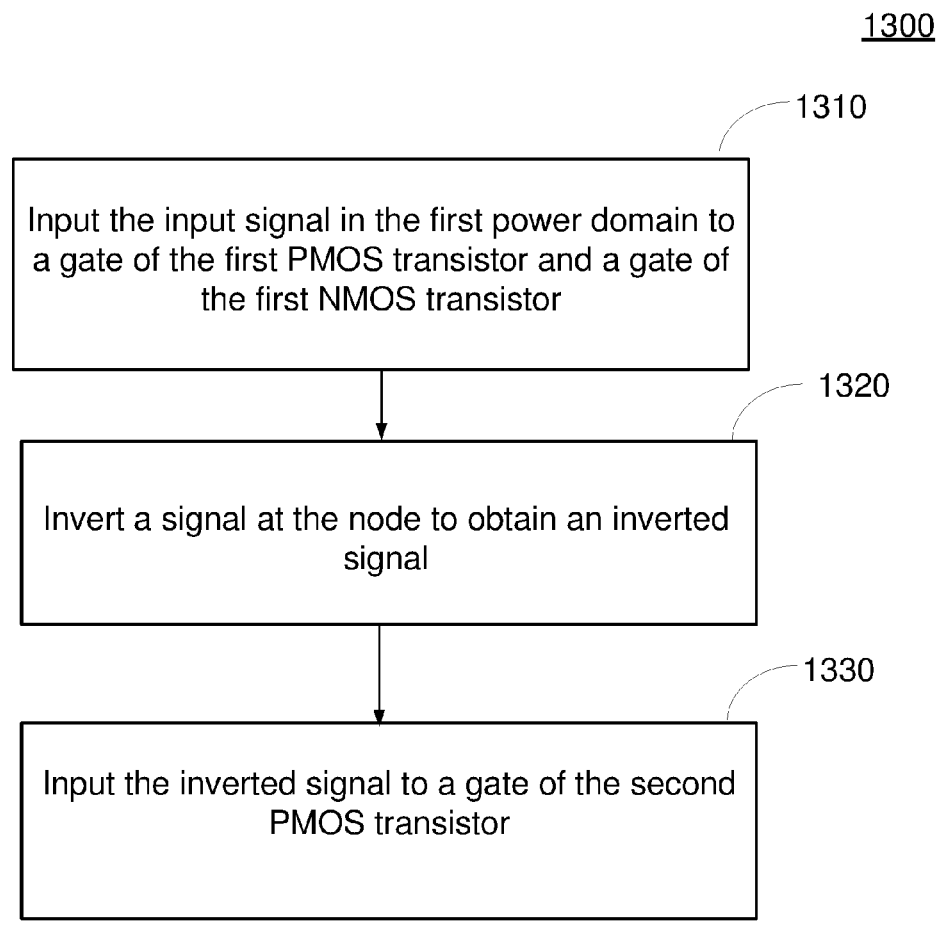
FIG. 13 is a flowchart illustrating a method for level shifting an input signal from a first power domain to a second power domain according to certain aspects of the present disclosure.

FIG. 13 is a flowchart illustrating a method 1300 for level shifting an input signal from a first power domain to a second power domain using a voltage level shifter. The voltage level shifter (e.g., voltage level shifter 810) includes first and second p-type metal-oxide-semiconductor (PMOS) transistors (e.g., first and second PMOS transistor 835 and 840) coupled in series between a supply voltage (e.g., vddout) of the second power domain and a node (e.g., node 820), and a first n-type metal-oxide-semiconductor (NMOS) transistor (e.g., first NMOS transistor 830) coupled between the node and a ground.

At step 1310, an input signal in the first power domain is input to a gate of the first PMOS transistor and a gate of the first NMOS transistor. For example, the input signal may have a voltage range that is at least 20 percent lower than the supply voltage (e.g., vddout) of the second power domain.

At step 1320, a signal at the node is inverted to obtain an inverted signal. For example, the signal at the node may be inverted using an inverter (e.g., inverter 850) that is powered by the supply voltage of the second power domain so that the voltage range of the inverted signal is approximately equal to the supply voltage (e.g., vddout) of the second power domain.

At step 1330, the inverted signal is input to a gate of the second PMOS transistor.

It is to be appreciated that steps 1310, 1320 and 1330 may be performed in different orders, and that two or more of steps 1310, 1320 and 1330 may be performed concurrently.

The decoder 170 discussed above may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A voltage level shifter, comprising:
    a first NOR gate having a first input configured to receive a first input signal in a first power domain, a second input configured to receive an enable signal in a second power domain, a third input, and an output; and
    a second NOR gate having a first input configured to receive a second input signal in the first power domain, a second input configured to receive the enable signal in the second power domain, a third input coupled to the output of the first NOR gate, and an output coupled to the third input of the first NOR gate;
    wherein the first and second NOR gates are powered by a supply voltage of the second power domain.

2. The voltage level shifter of claim 1, wherein each of the first and second input signals has a voltage range approximately equal to a first voltage range, the enable signal has a voltage range approximately equal to a second voltage range, and the second voltage range is greater than the first voltage range.

3. The voltage level shifter of claim 2, wherein the output of each of the first and second NOR gates has a voltage range approximately equal to the second voltage range.

4. The voltage level shifter of claim 1, wherein the first and second input signals are complementary.

5. The voltage level shifter of claim 1, wherein the first NOR gate comprises:
    first, second and third p-type metal-oxide-semiconductor (PMOS) transistors coupled in series between the supply voltage of the second power domain and the output of the first NOR gate; and
    first, second and third n-type metal-oxide-semiconductor (NMOS) transistors coupled in parallel between the output of the first NOR gate and a ground;
    wherein each of the first, second and third inputs of the first NOR gate is coupled to a gate of a respective one of the first, second and third PMOS transistors, and each of the first, second and third inputs of the first NOR gate is coupled to a gate of a respective one of the first, second and third NMOS transistors.

6. The voltage level shifter of claim 1, wherein the first input of the first NOR gate is coupled to a buffer in the first power domain.

7. The voltage level shifter of claim 1, wherein the first and second NOR gates are configured to output logic zero at the outputs of the first and second NOR gate when the enable signal is logic one, and to level shift the first and second input signals from the first power domain to the second power domain when the enable signal is logic zero.

8. A method for performing voltage level shifting using a voltage level shifter, the voltage level shifter comprising first and second cross-coupled NOR gates, the method comprising:
    inputting a first input signal in a first power domain to the first NOR gate;
    inputting a second input signal in the first power domain to the second NOR gate; and
    inputting an enable signal in a second power domain to the first and second NOR gates to enable the voltage level shifter.

9. The method of claim 8, wherein each of the first and second input signals has a voltage range approximately equal to a first voltage range, the enable signal has a voltage range approximately equal to a second voltage range, and the second voltage range is greater than the first voltage range.

10. The method of claim 9, wherein an output of each of the first and second NOR gates has a voltage range approximately equal to the second voltage range.

11. The method of claim 8, wherein the first and second NOR gates are powered by a supply voltage of the second power domain.

12. The method of claim 8, wherein inputting the enable signal in the second power domain to the first and second NOR gates to enable the voltage level shifter comprises transitioning the enable signal from logic one to logic zero.

13. The method of claim 12, wherein each of the first and second input signals has a voltage range approximately equal to a first voltage range, the enable signal has a voltage range approximately equal to a second voltage range, and the second voltage range is greater than the first voltage range.

14. An interface, comprising:
   a first buffer in a first power domain; and
   a voltage level shifter, comprising:
      a first NOR gate having a first input configured to receive a first input signal from the first buffer in the first power domain, a second input configured to receive an enable signal in a second power domain, a third input, and an output; and
      a second NOR gate having a first input configured to receive a second input signal in the first power domain, a second input configured to receive the enable signal in the second power domain, a third input coupled to the output of the first NOR gate, and an output coupled to the third input of the first NOR gate;
      wherein the first and second NOR gates are powered by a supply voltage of the second power domain.

15. The interface of claim 14, further comprises a second buffer in the second power domain, wherein the output of one of the first and second NOR gates is coupled to the second buffer.

16. The interface of claim 14, wherein each of the first and second input signals has a voltage range approximately equal to a first voltage range, the enable signal has a voltage range approximately equal to a second voltage range, and the second voltage range is greater than the first voltage range.

17. The interface of claim 16, wherein the output of each of the first and second NOR gates has a voltage range approximately equal to the second voltage range.

18. The interface of claim 14, wherein the first and second input signals are complementary.

19. The interface of claim 14, wherein the first NOR gate comprises:
   first, second and third p-type metal-oxide-semiconductor (PMOS) transistors coupled in series between the supply voltage of the second power domain and the output of the first NOR gate; and
   first, second and third n-type metal-oxide-semiconductor (NMOS) transistors coupled in parallel between the output of the first NOR gate and a ground;
   wherein each of the first, second and third inputs of the first NOR gate is coupled to a gate of a respective one of the first, second and third PMOS transistors, and each of the first, second and third inputs of the first NOR gate is coupled to a gate of a respective one of the first, second and third NMOS transistors.

20. The interface of claim 14, wherein the first and second NOR gates are configured to output logic zero at the outputs of the first and second NOR gate when the enable signal is logic one, and to level shift the first and second input signals from the first power domain to the second power domain when the enable signal is logic zero.

21. The interface of claim 14, further including a decoder configured to receive an address signal, to set the enable signal to logic zero if the address signal addresses the first buffer, and to set the enable signal to logic one if the address signal does not address the first buffer.

22. The interface of claim 21, wherein each of the first and second input signals has a voltage range approximately equal to a first voltage range, the enable signal has a voltage range approximately equal to a second voltage range, and the second voltage range is greater than the first voltage range.

* * * * *